(12) United States Patent
Lee et al.

(10) Patent No.: US 10,770,677 B2
(45) Date of Patent: Sep. 8, 2020

(54) DISPLAY APPARATUS

(71) Applicant: LG Display Co., Ltd., Seoul (KR)

(72) Inventors: Hyo-Sung Lee, Gwangmyeong-si (KR); Mi-Jin Han, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/591,273

(22) Filed: Oct. 2, 2019

(65) Prior Publication Data
US 2020/0111990 A1    Apr. 9, 2020

(30) Foreign Application Priority Data
Oct. 8, 2018    (KR) .................. 10-2018-0119837

(51) Int. Cl.
*H01L 51/52*    (2006.01)

(52) U.S. Cl.
CPC .. *H01L 51/5237* (2013.01); *H01L 2251/5338* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,348,362 B2 * | 5/2016 | Ko | .......... | G06F 1/1626 |
| 9,673,423 B2 * | 6/2017 | Lee | .......... | H01L 51/0097 |
| 9,811,119 B2 * | 11/2017 | Seo | .......... | G06F 1/1652 |
| 9,818,974 B2 * | 11/2017 | Kwon | .......... | H01L 51/5237 |
| 9,913,392 B2 * | 3/2018 | Cavallaro | .......... | G06F 1/16 |
| 9,958,976 B2 * | 5/2018 | Endo | .......... | G06F 1/1652 |
| 10,038,154 B2 * | 7/2018 | Lee | .......... | H01L 51/5243 |
| 10,120,224 B2 * | 11/2018 | Lee | .......... | H05K 999/99 |
| 10,139,879 B2 * | 11/2018 | Yamazaki | .......... | G06F 1/263 |
| 10,268,296 B2 * | 4/2019 | Choi | .......... | G06F 3/0416 |
| 10,359,810 B2 * | 7/2019 | Miyake | .......... | H01K 1/00 |
| 10,374,194 B2 * | 8/2019 | Son | .......... | H01L 51/0097 |
| 10,423,196 B2 * | 9/2019 | Seo | .......... | G06F 1/1652 |
| 10,439,017 B2 * | 10/2019 | Kim | .......... | H01L 27/3276 |
| 10,497,762 B2 * | 12/2019 | Li | .......... | H01L 51/56 |
| 10,528,170 B2 * | 1/2020 | Choi | .......... | H01L 27/3262 |
| 2013/0163255 A1 * | 6/2013 | Kim | .......... | H01L 51/5237 362/311.04 |
| 2015/0187279 A1 * | 7/2015 | Lee | .......... | G09G 3/3225 257/40 |
| 2016/0164023 A1 * | 6/2016 | Choi | .......... | G06F 3/0412 257/99 |
| 2017/0338286 A1 * | 11/2017 | Oh | .......... | H01L 51/5281 |
| 2019/0140201 A1 * | 5/2019 | Kim | .......... | G06F 3/0443 |
| 2019/0143638 A1 * | 5/2019 | Park | .......... | B32B 27/08 361/820 |

(Continued)

*Primary Examiner* — Lisa Lea-Edmonds
(74) *Attorney, Agent, or Firm* — Birch, Stewart, Kolasch & Birch, LLP

(57) ABSTRACT

A display apparatus can include a flexible display panel including at least one bending area; a first mid-frame disposed on a rear surface of the flexible display panel at a central area of the flexible display panel based on the at least one bending area; a second mid-frame disposed on the rear surface of the flexible display panel at an edge area of the flexible display panel based on the at least one bending area, the second mid-frame being spaced apart from the first mid-frame; and a bending guide configured to maintain a bent angle between the first mid-frame and the second mid-frame.

20 Claims, 6 Drawing Sheets

(56) References Cited

U.S. PATENT DOCUMENTS

| 2019/0165300 A1* | 5/2019 | Lee | H01L 51/5237 |
| 2019/0229171 A1* | 7/2019 | Nishinohara | H01L 27/3276 |
| 2019/0318689 A1* | 10/2019 | Kim | H01L 51/5237 |

* cited by examiner

FIG. 6

| | ONLY PANEL | GLASS WINDOW (500um) | H/C WINDOW (75um) |
|---|---|---|---|
| STRUCTURE | pOLED / JIG JIG | Cover Glass / OCA / pOLED / JIG JIG | Cover Film / OCA / pOLED / JIG JIG |
| Test Results 10cm | | OK | |
| Test Results 15cm | OK | DAMAGE TO GLASS, OLED WHITE SPOT | |
| Test Results 30cm | Line Defect | | |
| Test Results 50cm | | | OK |

DISPLAY APPARATUS

CROSS REFERENCE TO RELATED APPLICATION

This application claims the priority benefit of Korean Patent Application No. 10-2018-0119837, filed in the Republic of Korea on Oct. 8, 2018, which is hereby incorporated by reference as if fully set forth herein.

BACKGROUND OF THE INVENTION

Field of the Invention

The present invention relates to a display apparatus, and more particularly, to a display apparatus in which a bending area of a flexible display panel can be bent into a minimally rounded shape.

Discussion of the Related Art

Image displays, which display various pieces of information on a screen, are a core technology in the age of information and communication and have been developed to satisfy thinness, light-weight and high-performance trends. Therefore, an organic light emitting diode (OLED) display, which corresponds to a kind of flat display which can reduce weight and volume to make up for drawbacks of a cathode ray tube (CRT), is self-illuminating and thus can omit a back light source unit, is now in the spotlight.

Such an organic light emitting diode display displays an image through a plurality of subpixels arranged in a matrix. Each of the subpixels includes a light emitting element, and a pixel driving circuit including a plurality of transistors to independently drive the light emitting element.

Recently, from the angle of various applications, demand for a flexible display which may be inserted into a pocket or a small pouch to be easy to carry and display an image through a screen having a larger size than in carrying. The flexible display is folded or partially bent while carrying or during storage, and when a user desires to display an image, the flexible display is unfolded and thus an image display area may be increased, user visibility may be improved and immersiveness may be raised.

Particularly, among various types of flexible displays, many studies on a rollable display which has excellent portability and a large-scale effect when it is unrolled as compared to when it is rolled are underway.

However, failure may occur during a process of bending a flexible display panel, and bending of a bending area of the flexible display panel into a very small rounded shape is technically difficult.

SUMMARY OF THE INVENTION

Accordingly, the present invention is directed to a display apparatus that substantially obviates one or more problems due to limitations and disadvantages of the related art.

An object of the present invention is to provide a display apparatus which may allow separated mid-frames to be coupled to the rear surface of a display panel so that the display panel may be bent into an extremely small rounded shape, and allow a semi-hardened type cover window to be coupled to the display panel having such a bent structure to prevent damage to a cover window during a manufacturing process of the display apparatus.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display apparatus in which a bending area of a flexible display panel is bent into a very small rounded shape through a first mid-frame and a second mid-frame, separated from each other, and a bending guide is provided.

In another aspect of the present invention, a display apparatus in which a semi-hardened type cover window is provided on an upper surface of the display panel so that the cover window is completely hardened under the condition that bending of the display panel has been completed, to prevent damage to the cover window during a bending process is provided.

It is to be understood that both the foregoing general description and the following detailed description of the present invention are examples and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 6 is a reference view illustrating impact test results of a display apparatus in an example in accordance with embodiments of the present invention and display apparatuses in comparative examples.

DETAILED DESCRIPTION OF THE EMBODIMENTS

Figure 1:
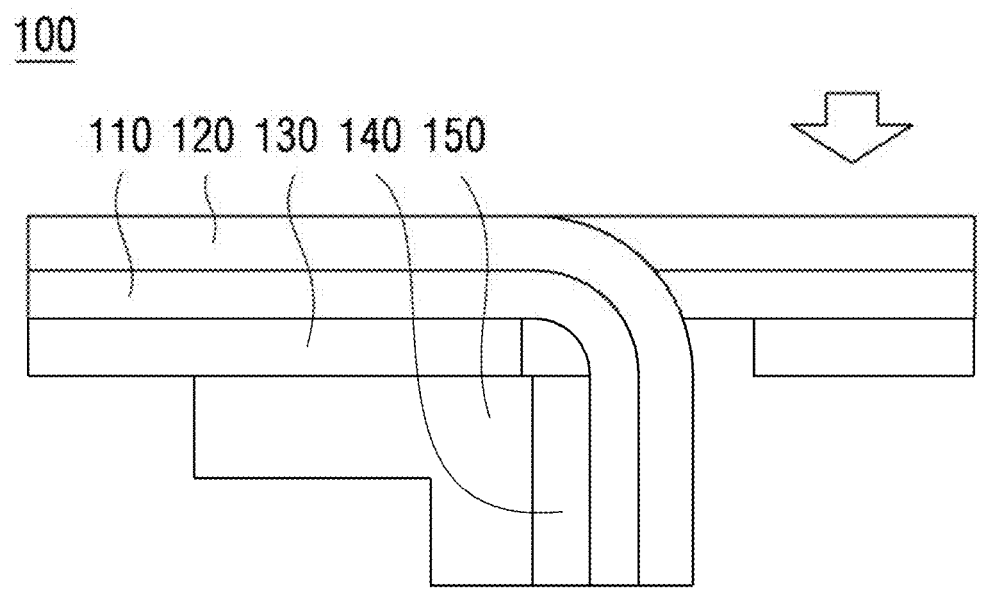
FIG. 1 is a cross-sectional view illustrating a display apparatus in accordance with embodiments of the present invention.

Reference will now be made in detail to the example embodiments of the present invention, examples of which are illustrated in the accompanying drawings. Some parts which represent the same elements in the accompanying drawings are denoted by the same reference numerals even though they are depicted in different drawings. In the following description of the present invention, a detailed description of known functions and configurations incorporated herein will be omitted when it may make the subject matter of the present invention rather unclear. Those skilled in the art will appreciate that characteristics disclosed in the drawings are exaggerated, reduced or simplified for ease of description, and the drawings and elements thereof are not always illustrated to scale.

Figure 2:
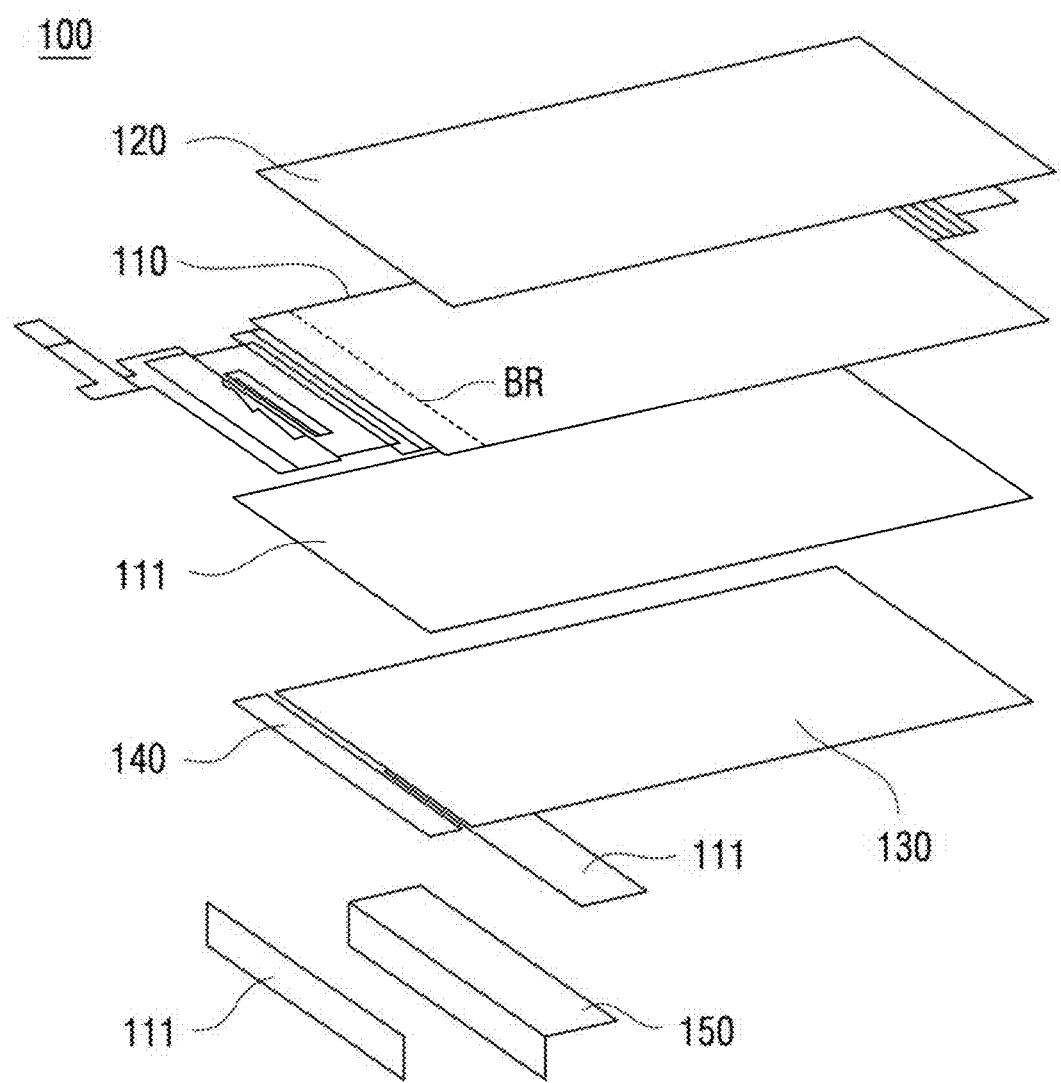
FIG. 2 is an exploded perspective view of the display apparatus shown in FIG. 1 according to an embodiment of the present invention.

FIG. 1 is a cross-sectional view illustrating a display apparatus in accordance with embodiments of the present invention, and FIG. 2 is an exploded perspective view of the display apparatus shown in FIG. 1.

Referring to FIGS. 1 and 2, a display apparatus 100 in accordance with one embodiment of the present invention includes a flexible display panel 110, a first mid-frame 130 and a second mid-frame 140 which are separated from each other, and a bending guide 150.

First, the flexible display panel 110 displays an image through a pixel array in which subpixels are arranged in a matrix. A unit pixel can include at least three subpixels selected from white (W), red (R), green (G) and blue (B) subpixels, which can express white through mixing of colors. For example, the unit pixel can include red (R), green (G) and blue (B) subpixels, white (W), red (R) and green (G) subpixels, blue (B), white (W) and red (R) subpixels, green (G), blue (B) and white (W) subpixels, or white (W), red (R), green (G) and blue (B) subpixels.

Further, a power supply unit is provided to generate and output various driving voltages used by a timing controller, a gate driver, a data driver, the flexible display panel 110 and the display apparatus 100, using input voltage. For example, the power supply unit generates and supplies a driving voltage of a digital circuit supplied to the data driver and the timing controller, a driving voltage of an analog circuit supplied to the data driver, and a gate on voltage (gate high voltage) and a gate low voltage (gate low voltage) used by the gate driver. The power supply unit generates a plurality of driving voltages when the flexible display panel 110 is driven and a reference voltage, and supplies these voltages to the flexible display panel 110 through the data driver.

The timing controller receives image data and basic timing control signals from an external system. The external system can be one of a computer, a TV system, a set-top box and a portable terminal system, such as a tablet or a mobile phone. The basic timing control signals can include a dot clock, a data enable signal, a vertical synchronous signal, a horizontal synchronous signal, etc.

The timing controller generates and supplies data control signals and gate control signals to respectively control driving timings of the data driver and the gate driver using the basic timing control signals supplied from the outside and timing setup information (start timing, pulse width, etc.) stored in an inner register.

Further, the flexible display panel 110 can include an integrated haptic touchscreen. In this situation, the touchscreen can be located between a cover glass and the flexible display panel 110. Here, the flexible display panel 110 can be employ not only an organic light emitting panel but also a liquid crystal panel.

A cover window 120 is provided on the front surface of the flexible display panel 110, e.g., a display surface.

The cover window 120 can use a resin which can be hardened through ultraviolet (UV) light or heat. Therefore, since the cover window 120 in a state prior to a completely hardened state thereof is adhered to the upper surface of the flexible display panel 110 prior to bending of a bending area BR of the flexible display panel 110, and is completely hardened by secondary hardening after completion of bending of the bending area BR, a process of bending the flexible display panel 110 is easily performed and there is no danger of the cover window 120 being damaged during the bending process. Further, the cover window 120 can be universally adhered to the flexible display panel 110 having any bent shape, and thus a range of application of the cover window 120 to products is increased as compared to the conventional cover glass.

An adhesive tape 111 is adhered to the rear surface of the flexible display panel 110 under the condition that the first mid-frame 130 and the second mid-frame 140, which are separated from each other, are simultaneously adhered to the adhesive tape 111. Of course, alignment is carried out such that a space between the first mid-frame 130 and the second mid-frame 140 corresponds to the bending area BR of the flexible display panel 110.

When adhesion of the first mid-frame 130 and the second mid-frame 140 to the flexible display panel 110 is completed, the upper surface of the bending guide 150 is adhered to the rear surface of the first mid-frame 130, and an edge area ER (referring to FIG. 3B) of the flexible display panel 110 and the second mid-frame 140 are bent about the bending area BR from the first mid-frame 130 and thus adhered to the side surface of the bending guide 150.

Figure 3A:
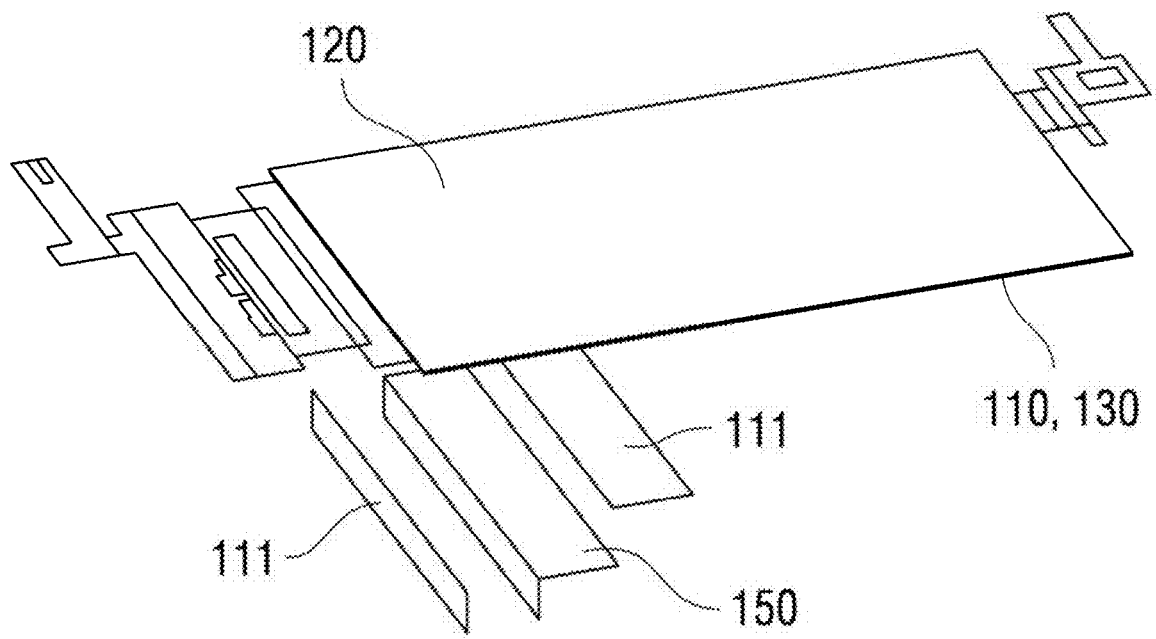
FIGS. 3A-3C are reference views partially illustrating a process of bending the display apparatus shown in FIG. 2 according to embodiments of the present invention.
Figure 3B:
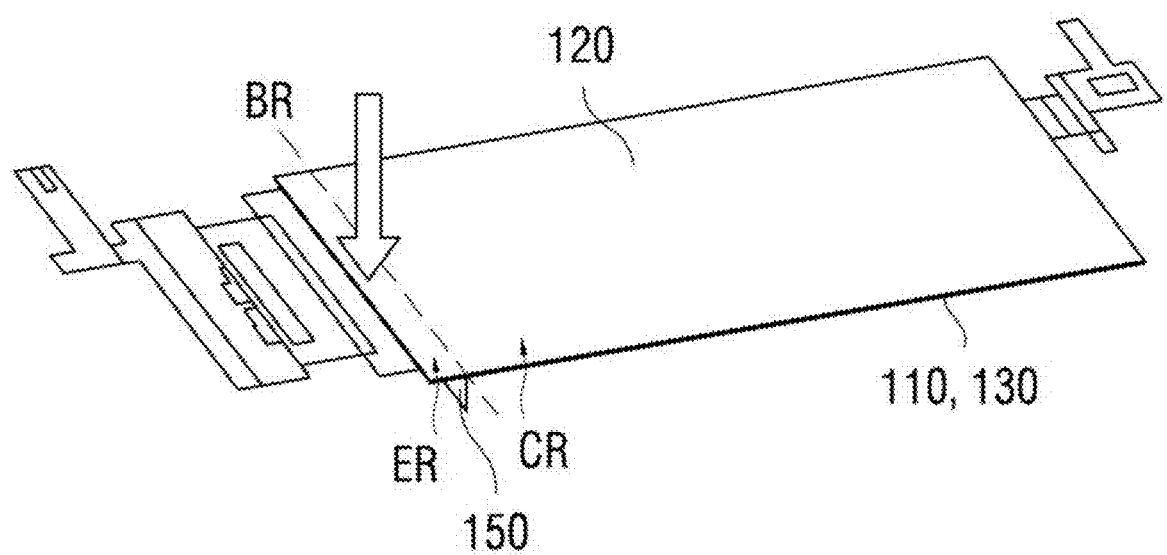
Figure 3C:
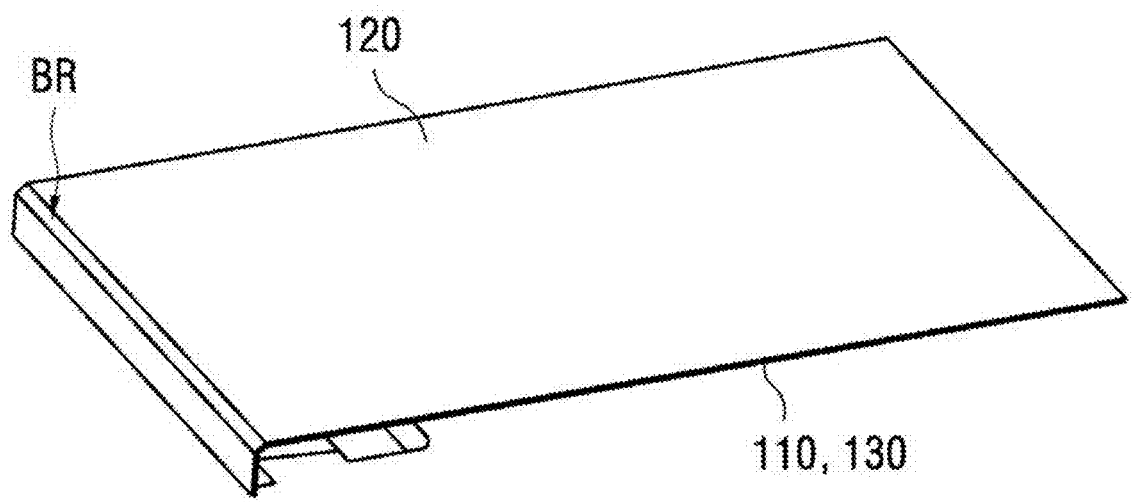

FIGS. 3A to 3C are reference views partially illustrating a process of bending the display apparatus shown in FIG. 2.

Referring to FIG. 3A, the cover window 120 which is primarily hardened is adhered to the upper surface of the flexible display panel 110. Here, the cover window 120 is in an approximately gel state prior to a completely hardened state thereof.

The bending guide 150 is bent at a predetermined angle at which the flexible display panel 110 will be bent, and, in this embodiment, is bent at a right angle to form an approximately "L" shape. Further, an adhesive tape 111 is adhered to the upper and side surfaces of the bending guide 150.

Referring to FIG. 3B, the upper surface of the bending guide 150 is adhered to a central area CR of the rear surface of the flexible display panel 110 based on the bending area BR. Here, the central area CR is disposed adjacent to the bending area BR, and the edge area ER of the flexible display panel 110 is disposed across the bending area BR from the central area CR. In the flexible display panel 110, as the bending area BR is bent from the central area CR, the edge area ER becomes the side surface of the flexible display panel 110. Since the first mid-frame 130 is located in the central area CR of the flexible display panel 110, the upper surface of the bending guide 150 is adhered to the first mid-frame 130.

Further, a corner part of the bending guide 150 where the upper and side surfaces of the bending guide 150 are connected is disposed to correspond to the center of the bending area BR.

Referring to FIG. 3C, as the edge area ER of the flexible display panel 110 is pressed, the flexible display panel 110 is bent and thus divided into an upper display area and a side display area. Here, the side surface of the bending guide 150 is adhered to the second mid-frame 140 (with reference to FIG. 2) adhered to the rear surface of the bent edge area ER of the flexible display panel 110.

Thereby, since the flexible display panel 110 is bent through the space between the first mid-frame 130 and the second mid-frame 140 on the rear surface of the flexible display panel 110, reaction force (force occurring in a direction of unfolding the flexible display panel 110 into a flat surface state) due to the mid-frames 130 and 140 does not occur during the bending process, and thus, a very small rounded shape, e.g., having an extremely small radius, can be realized. Further, the bending guide 150 is not adhered to the flexible display panel 110 prior to bending, and adhesion of the bending guide 150 to the flexible display panel 110 is completed at a point of time when bending of the flexible display panel 110 is completed, and thus, the bent state of the flexible display panel 110 can be maintained without reaction force.

Figure 4:
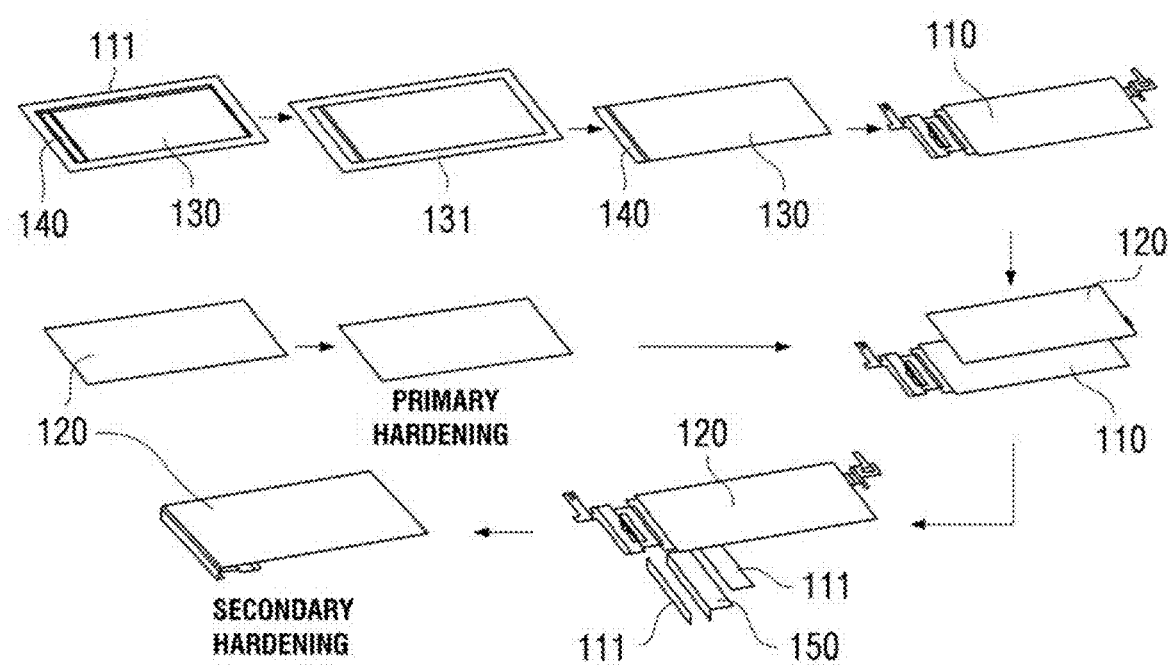
FIG. 4 is a reference view sequentially illustrating a method of manufacturing a display apparatus including a process of bending the display apparatus shown in FIGS. 3A-3C, according to an embodiment.

FIG. 4 is a reference view sequentially illustrating a method of manufacturing a display apparatus including the process of bending the display apparatus shown in FIGS. 3A to 3C. Hereinafter, respective operations of the process of bending the display apparatus in accordance with embodiments of the present invention will be sequentially described in detail.

First, the mid-frames 130 and 140 are adhered to the rear surface of the flexible display panel 110 through the adhesive tape 111. Here, the first mid-frame 130 and the second mid-frame 140 are simultaneously adhered to the adhesive tape 111, like one sheet.

When adhesion of the mid-frames 130 and 140 to the flexible display panel 110 is completed, a dummy mid-frame 131 located at the edge of the mid-frames 130 and 140 or the space between the first mid-frame 130 and the second mid-frame 140 is removed. Thereby, the first mid-frame 130 and the second mid-frame 140 are located on the rear surface of the flexible display panel 110 under the condition that the first mid-frame 130 and the second mid-frame 140 are separated from each other.

Before the cover window 120 is adhered to the upper surface of the flexible display panel 110, a resin in a liquid state for the cover window 120 becomes in a gel state by primary hardening, and then the cover window 120 in the gel state is adhered to the upper surface of the flexible display panel 110.

When the cover window 120 in the gel state is adhered to the flexible display panel 110, the upper surface of the bending guide 150 is adhered to the edge of the first mid-frame 130 on the rear surface of the flexible display panel 110. Here, the adhesive tape 111 is provided not only on the upper surface but also on the side surface of the bending guide 150.

Thereafter, when the edge of the cover window 120 in the gel state is pressed, the cover window 120 and the flexible display panel 110 are bent together and thus the rear surface of the second mid-frame 140 is adhered to the side surface of the bending guide 150.

Thereby, bending of the cover window 120 and the flexible display panel 110 is completed. When bending of the cover window 120 and the flexible display panel 110 is completed, the cover window 120 is completely hardened into a solid state by secondary hardening.

Figure 5:
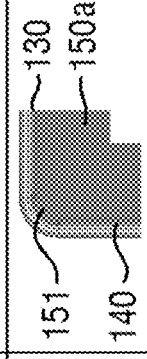
FIG. 5 is a reference view illustrating mid-frames of the display apparatus shown in FIG. 2, in accordance with other embodiments of the present invention.

FIG. 5 is a reference view illustrating mid-frames of the display apparatus shown in FIG. 2, in accordance with other embodiments of the present invention.

Referring to FIG. 5, the mid-frames include a first mid-frame 130 and a second mid-frame 140, and the first mid-frame 130 and the second mid-frame 140 are spaced apart from each other by a designated space.

First, in type (A), a space between a first mid-frame 130 and a second mid-frame 140 has a relatively long distance. Further, during a bending process, a mold 151 is inserted into the space between the first mid-frame 130 and the second mid-frame 140. The mold 151 is provided at the corner of a bending guide 150a, and is inserted into the space between the first mid-frame 130 and the second mid-frame 140 during the bending process. Here, the bending guide 150a and the mold 151 are formed of a synthetic resin and adhered to the first mid-frame 130 and the second mid-frame 140. In the situation of type (A) using the mold type bending guide 150a, the mold 151 fills the space between the first mid-frame 130 and the second mid-frame 140 and can thus form a firmer structure.

Further, in type (B), a third mid-frame 134 is integrally provided between a first mid-frame 130 and a second mid-frame 140. Further, a predetermined perforated pattern 133 is formed on the third mid-frame 134 in a length direction. The perforated pattern 133 can facilitate bending of the third-mid-frame 134 during a process of bending the first mid-frame 130 and the second mid-frame 140. Further, since the third mid-frame 134 is not adhered to the bending area of the flexible display panel 110, reaction force due to the third mid-frame 134 is not transmitted to the bending area. Further, the third mid-frame 134 supports a space between the first mid-frame 130 and the second mid-frame 140 and can thus more firmly support the first mid-frame 130 and the second mid-frame 140.

Moreover, type (C) has a structure corresponding to the above-described embodiment of the present invention, in which a space between a first mid-frame 130 and a second mid-frame 140 has a relatively short distance and the first mid-frame 130 and the second mid-frame 140 are adhered to a bending guide 150. Therefore, an extremely small radius of the bent flexible display panel 110 can be induced through the space between the first mid-frame 130 and the second mid-frame 140, and additional reaction force is not provided to the flexible display panel 110 and thus stable coupling can be achieved.

FIG. 6 is a reference view illustrating impact test results of a display apparatus in an example in accordance with embodiments of the present invention and display apparatuses in comparative examples.

FIG. 6 illustrates a table representing test results of a structure in which only a display panel is employed, a structure in which a glass window and a display panel are coupled, and a structure in which a cover window and a display panel are coupled, in a ball drop test which is performed according to height.

First, as results of the test which was performed under the condition that the structure in which only the display panel is employed was supported by a jig, no damage to the display panel occurred up to a height of 15 cm, but the display panel was damaged and thus a line defect occurred when a ball dropped from a height of 30 cm.

Next, as results of the test which was performed under the condition that the structure in which the glass window and the display panel are coupled was supported by the jig, no damage to the structure occurred up to a height of 10 cm, but the glass window was damaged and thus a white spot occurred on the display panel when the ball dropped from a height of 15 cm.

Finally, as results of the test which was performed under the condition that the structure of embodiments of the present invention in which the cover window is hardened on the display panel and mid-frames are coupled to the rear surface of the display panel was supported by the jig, no damage to the structure occurred up to a height of 50 cm.

In the structure in which only the display panel is employed, the display panel withstood the ball dropped from the height of 15 cm but was damaged due to the ball dropped from the height of 30 cm and, in the structure in which the glass window and the display panel are coupled, the glass window absorbed all impact and thus was damaged due to the ball dropped even from the height of 15 cm. Further, in the structure of embodiments of the present invention in which the cover window is coupled to the display panel, both the film-type cover window and the mid-frames absorbed all impact and thus the display panel was not damaged even when the ball was dropped from the height of 50 cm.

Therefore, the display apparatus of embodiments of the present invention can allow the separated mid-frames to be adhered to the rear surface of the display panel so that the display panel can be bent to have an extremely small radius, allow the cover window to be hardened after processing into a designated shape and thus to correspond to various bent shapes of the display apparatus, and provide a structure strong on impact absorption and thus has increased durability.

As apparent from the above description, a display apparatus in accordance with embodiments of the present invention includes a first mid-frame and a second mid-frame separated from each other based on a bending area of a flexible display panel and provided on the rear surface of the flexible display panel, the mid-frames are coupled to the flexible display panel through a bending guide and thus the display panel can be bent into a very small rounded shape, a semi-hardened type cover window is provided to correspond to the display panel having the very small rounded shape and thus the cover window is completely hardened under the condition that bending of the display panel has been completed, thereby preventing damage to the cover window and increasing ease of assembly and productivity of the display apparatus.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display apparatus comprising:
   a flexible display panel including at least one bending area;
   a first mid-frame disposed on a rear surface of the flexible display panel at a central area of the flexible display panel based on the at least one bending area;
   a second mid-frame disposed on the rear surface of the flexible display panel at an edge area of the flexible display panel based on the at least one bending area, the second mid-frame being spaced apart from the first mid-frame; and
   a bending guide configured to maintain a bent angle between the first mid-frame and the second mid-frame.

2. The display apparatus according to claim 1, further comprising a cover window disposed on an upper surface of the flexible display panel,
   wherein the cover window is coupled to the upper surface of the flexible display panel while in a partially hardened state by primary hardening, before bending of the at least one bending area of the flexible display panel.

3. The display apparatus according to claim 2, wherein the cover window is completely hardened by secondary hardening, after bending of the at least one bending area of the flexible display panel.

4. The display apparatus according to claim 1, further comprising a third mid-frame disposed in a space between the first mid-frame and the second mid-frame to integrally connect the first mid-frame and the second mid-frame, the space between the first mid-frame and the second mid-frame corresponding to the at least one bending area.

5. The display apparatus according to claim 4, wherein the third mid-frame includes a perforated pattern disposed along a longitudinal direction of the third mid-frame.

6. The display apparatus according to claim 1, wherein the bending guide is adhered to rear surfaces of the first mid-frame and the second mid-frame, as the flexible display panel is bent around the at least one bending area.

7. The display apparatus according to claim 1, wherein the bending guide includes a mold inserted into a space between the first mid-frame and the second mid-frame, during bending of the flexible display panel.

8. The display apparatus according to claim 1, wherein the bent angle between the first mid-frame and the second mid-frame is approximately 90 degrees.

9. The display apparatus according to claim 1, further comprising:
   a first adhesive member disposed between a first portion of the bending guide and the first mid-frame;
   a second adhesive member disposed between a second portion of the bending guide and the second mid-frame; and
   a first gap between the first mid-frame and the second mid-frame,
   wherein the first and second adhesive members are located at opposite sides of the first gap.

10. The display apparatus according to claim 1, wherein the bending guide is approximately "L" shaped.

11. The display apparatus according to claim 1, wherein an upper edge of the second mid-frame adjacent to a vertex of the bent angle is parallel and flush with an upper surface of the bending guide, and
    wherein a side edge of the first mid-frame adjacent to the vertex of the bent angle is parallel with a side surface of the bending guide closest to the vertex of the bent angle, the side edge of the first mid-frame and the side surface of the bending guide being non-flush relative to each other.

12. A display apparatus comprising:
    a flexible display panel including at least one bending area;
    a first mid-frame disposed on a rear surface of the flexible display panel at a central area of the flexible display panel based on the at least one bending area;
    a second mid-frame disposed on the rear surface of the flexible display panel at an edge area of the flexible display panel based on the at least one bending area, the second mid-frame being spaced apart from the first mid-frame; and
    a cover window disposed on an upper surface of the flexible display panel, the cover window in a partially hardened state by primary hardening being coupled to the upper surface of the flexible display panel, before bending of the at least one bending area of the flexible display panel.

13. The display apparatus according to claim 12, further comprising a bending guide coupled to the first mid-frame and the second mid-frame to maintain a bent angle of the flexible display panel.

14. The display apparatus according to claim 13, further comprising:
    a first adhesive member disposed between a first portion of the bending guide and the first mid-frame;
    a second adhesive member disposed between a second portion of the bending guide and the second mid-frame; and a first gap between the first mid-frame and the second mid-frame,
wherein the first and second adhesive members are located at opposite sides of the first gap.

15. The display apparatus according to claim 12, wherein the cover window is completely hardened by secondary hardening, after bending of the at least one bending area of the flexible display panel.

16. The display apparatus according to claim 12, further comprising a third mid-frame disposed in a space between the first mid-frame and the second mid-frame, the space between the first mid-frame and the second mid-frame corresponding to the at least one bending area,
wherein the third mid-frame includes a perforated pattern disposed along a longitudinal direction of the third mid-frame.

17. A method of manufacturing a display apparatus, the method comprising:
performing a primary hardening treatment on a cover window to place the cover window in a partially hardened state;
disposing the cover window on a flexible display panel, the flexible display panel having a bending area;
disposing the flexible display panel and the cover window on a first mid-frame and a second mid-frame while the first and second mid-frames are spaced apart from each other and the cover window is in the partially hardened state;
attaching the first and second mid-frames to a bending guide having a bent angle via at least one adhesive member by bending the cover window around the bent angle while in the partially hardened state; and
performing a secondary hardening treatment on the cover window to place the cover window in a hardened state, after completion of the bending the cover window around the bent angle.

18. The method according to claim 17, wherein the attaching the first and second mid-frames to the bending guide includes:
adhering a first adhesive member between the first mid-frame and an upper portion of the bending guide, and
adhering a second adhesive member between the second mid-frame and a side portion of the bending guide.

19. The method according to claim 17, wherein the bent angle is approximately 90 degrees.

20. The method according to claim 17, wherein the bending guide is approximately "L" shaped.

* * * * *